United States Patent
Notzel et al.

(10) Patent No.: US 11,521,852 B2
(45) Date of Patent: Dec. 6, 2022

(54) INGAN EPITAXY LAYER AND PREPARATION METHOD THEREOF

(71) Applicant: South China Normal University, Guangdong (CN)

(72) Inventors: Richard Notzel, Guangdong (CN); Peng Wang, Guangdong (CN); Stefano Sanguinetti, Milan (IT); Guofu Zhou, Guangdong (CN)

(73) Assignee: South China Normal University, Guangdong (CN)

( * ) Notice: Subject to any disclaimer, the term of this patent is extended or adjusted under 35 U.S.C. 154(b) by 0 days.

(21) Appl. No.: 17/254,102

(22) PCT Filed: Dec. 19, 2018

(86) PCT No.: PCT/CN2018/122002
§ 371 (c)(1),
(2) Date: Jun. 1, 2021

(87) PCT Pub. No.: WO2020/124419
PCT Pub. Date: Jun. 25, 2020

(65) Prior Publication Data
US 2021/0272802 A1    Sep. 2, 2021

(51) Int. Cl.
*H01L 21/00* (2006.01)
*H01L 21/02* (2006.01)

(52) U.S. Cl.
CPC .... *H01L 21/02293* (2013.01); *H01L 21/0254* (2013.01); *H01L 21/0262* (2013.01); *H01L 21/02381* (2013.01); *H01L 21/02458* (2013.01); *H01L 21/02603* (2013.01); *H01L 21/02631* (2013.01)

(58) Field of Classification Search
CPC .......... H01L 21/02381; H01L 21/0262; H01L 21/02631
See application file for complete search history.

(56) References Cited

U.S. PATENT DOCUMENTS

| 9,396,936 B2 * | 7/2016 | Chang ................. H01L 29/2003 |
| 2012/0160157 A1 * | 6/2012 | Han ................. H01L 21/02502 117/109 |

FOREIGN PATENT DOCUMENTS

| CN | 101922015 A | 12/2010 |
| CN | 102822944 A | 12/2012 |
| CN | 106981549 A | 7/2017 |
| CN | 107346728 A | 11/2017 |
| CN | 108336195 A | 7/2018 |

(Continued)

OTHER PUBLICATIONS

Woo, H et al., "Correlation between pit formation and phase separation in thick InGaN film on a Si substrate", Current Applied Physics, vol. 18, Oct. 6, 2018, pp. 1558-1563. (Year: 2018).*

(Continued)

*Primary Examiner* — Reema Patel
(74) *Attorney, Agent, or Firm* — Vedder Price P.C.

(57) ABSTRACT

Provided are a method for preparing an InGaN-based epitaxial layer on a Si substrate (12), as well as a silicon-based InGaN epitaxial layer prepared by the method. The method may include the steps of: 1) directly growing a first InGaN-based layer (11) on a Si substrate (12); and 2) growing a second InGaN-based layer on the first InGaN-based layer (11).

16 Claims, 3 Drawing Sheets

(56) References Cited

FOREIGN PATENT DOCUMENTS

| CN | 108807617 A | 11/2018 |
|---|---|---|
| WO | 2011123303 | 10/2011 |

OTHER PUBLICATIONS

Cherns. D. et al., "The growth of In0.5Ga0.5N and InN layers on(111) Si using nanorod intermediate arrays", Journal ol Crystal Growth, vol. 384, Sep. 18, 2013, pp. 55-60.

Woo. H. et al., "Correlation between pit formation and phase separation in thick InGaN film on a Si substrate", Current Applied Physics, vol. 18, No. 12, Oct. 6, 2018, pp.

P. Aseev et al., "Near-infrared emitting In-rich InGaN layers grown directly on Si: Towards the whole composition range", Applied Physics Letters, vol. 106(7), 072102 (2015).

\* cited by examiner

INGAN EPITAXY LAYER AND PREPARATION METHOD THEREOF

The present application is a national phase entry under 35 USC § 371 of International Application PCT/CN2018/122002, filed Dec. 19, 2018, which claims the benefit of and priority to Chinese Patent Application No. 201811648671.3, filed Dec. 30, 2018, the entire disclosures of which are incorporated herein by reference.

TECHNICAL FIELD

The present disclosure relates to the field of optoelectronic and electrochemical materials. In particular, the present disclosure relates to an InGaN-based epitaxial layer and a preparation method thereof, and more particularly, to a method for direct, epitaxial growth of the InGaN-based epitaxial layer on a Si substrate, for optoelectronic/electrochemical devices such as light-emitting diodes, lasers, solar cells, high-power electronic amplifiers, photoelectrodes, and (bio-)sensors.

BACKGROUND

The fabrication of an InGaN-based materials on a silicon (Si) substrate by epitaxial growth techniques has widespread application prospects for optoelectronic and electrochemical devices, such as light-emitting diodes, lasers, solar cells, high-power electronic amplifiers, photoelectrodes, and (bio-)sensors. InGaN is an ideal semiconductor material for optoelectronic and electrochemical devices. InGaN exhibits a bandgap which is tunable from the ultraviolet band for GaN (3.4 eV/365 nm) to the near-infrared band fro InN (0.7 eV/1.7 μm) with increasing the In content. InGaN further has many advantages, such as a very high near-band absorption coefficient (10 times that of GaAs), a high carrier mobility and radiation resistance, chemical stability, biocompatibility, being composed entirely of non-toxic materials/elements.

The growth of InGaN on Si substrates is of high economic relevance due to the availability of large-area substrates of the highest crystal and surface quality at low cost and the possibility of the direct integration with mature Si technology. In order to obtain high-quality epitaxial InGaN-based materials on Si substrates, AlN, GaN or combined buffer layers are usually deposited first. However, this makes the fabrication process highly complex with the need to optimize such inserted buffer layers independently of the optimization of the InGaN-based material grown on the top thereof.

In addition, the GaN, AlN or combined buffer layers have a high lattice mismatch with the Si substrate, as well as with InGaN. The lattice mismatch between GaN or AlN with Si is larger than that between InGaN and Si. The lattice mismatch between GaN or AlN with Si increases with decreasing In content. While, the lattice mismatch between GaN or AlN with InGaN increases with increasing In content. Therefore, such GaN, AlN or combined buffer layers are neither compatible with the growth on Si substrate, nor compatible with the subsequent growth of the InGaN-based material. The lattice mismatch may introduce dislocations into the buffer layers per se and into the InGaN-based material grown on the top thereof, to release the strain which builds up during growth. The dislocations strongly reduce material growth quality, and thus have great impact on device performance.

It was reported that the InGaN-based materials with various In contents were directly grown on Si (111) substrates subjected to surface nitridation. However, the quality of the InGaN material layer obtained by this preparation method is inferior compared to the quality of the InGaN materials epitaxially grown by means of GaN, AlN or combined buffer layers.

For overcoming the negative effects caused by the lattice mismatch, there is an urgent need for developing a new method for directly growing InGaN-based materials over a whole In composition range on Si substrates without any GaN, AlN or combined buffer layers.

SUMMARY

In order to overcome the problems in the prior art, the present disclosure provides a method for preparing an InGaN epitaxial layer on a Si substrate. The method of the present disclosure allows the direct growth of a high-quality InGaN-based epitaxial layer on a Si substrate, which can effectively solve problems such as lattice mismatch. The InGaN-based epitaxial layer comprises a first InGaN-based layer, and a second InGaN-based layer which is subsequently grown. The InGaN-based epitaxial layer prepared by the method of the present disclosure can meet the requirements for optoelectronic and electrochemical applications such as light-emitting diodes, lasers, solar cells, high-power electronic amplifiers, photoelectrodes, and (bio-) sensors with high performance.

The present disclosure intends to provide a method for preparing an InGaN-based epitaxial layer on a silicon (Si) substrate, as well as a silicon-based InGaN epitaxial layer prepared by this method.

In one aspect, the present disclosure provides a method for preparing an InGaN-based epitaxial layer on a Si substrate, which comprises the steps of:

1) directly growing a first InGaN-based layer on a Si substrate; and
2) growing a second InGaN-based layer on the first InGaN-based layer.

Further, on the Si substrate, the first InGaN-based layer may be grown with metal modulation or at a high active-N-to-total metal flux ratio.

For the growth at a high active-N-to-total metal flux ratio, the active-N-to-total In/Ga metal flux ratio may be 2 or more, preferably be 5 or more, and most preferably be 5 to 10. For example, for the growth of the high active-N-to-total metal flux ratio, the active-N-to-total In/Ga metal flux ratio is 5, 6, 7, 8, 9 or 10. Further, the first InGaN layer may be obtained by growing at the high active-N-to-total metal flux ratio and comprise 5 to 15 atomic layers, and preferably 8 to 12 atomic layers.

Further, the metal modulated growth may comprise the steps of:

i) providing In, Ga and N fluxes simultaneously for time $t_1$;
ii) maintaining the N flux for time $t_2$, while interrupting the In and Ga fluxes; and
iii) repeating the steps i) and ii) by n times, wherein the time $t_1$ corresponds to the deposition of 0.1 to 2.0 InGaN atomic layers, preferably to the deposition of 0.4 to 0.7 InGaN atomic layer, and more preferably to the deposition of 0.4 to 0.5 InGaN atomic layer; the time $t_2$ corresponds to 2 to 20 seconds, and preferably to 8 to 12 seconds; and, n is an integer selected from 10 to 30, and is preferably an integer selected from 15 to 25. For example, the steps i) and ii) are repeated by 15, 16, 17, 18, 19, 20, 21, 22, 23, 24 or 25 times.

Further, in the above method of the present disclosure, the active N flux may be continuously supplied by a radio frequency active plasma source or by ammonia.

Further, in the above method of the present disclosure, the Ga plus In metal fluxes may be provided by setting Ga and In sources. The Ga and In sources are preferably pure Ga and In metals, or metalorganic precursors thereof. The metalorganic precursor for Ga may comprise triethylgallium (TEGa), trimethylgallium (TMGa), and the like. The metal organic precursor for In may comprise triethyl indium (TEIn), trimethyl indium (TMIn), and the like.

Further, in the above method of the present disclosure, the In content of the second InGaN-based epitaxial layer may be range from 0 to 1 by adjusting the In-to-Ga flux ratio.

For example, when the In-to-Ga flux ratio is 0.4 or less, the InGaN-based epitaxial layer has an In content of 30% or less, and preferably, the InGaN-based epitaxial layer is grown at a temperature from 600 to 900° C., and more preferably from 700 to 750° C. This relatively high growth temperature is common for ow-In-content InGaN materials, facilitating to obtain high crystal quality.

When the In-to-Ga flux ratio is higher than 0.4, the InGaN-based epitaxial layer has an In content of higher than 30%, and preferably, the InGaN-based epitaxial layer is grown at a temperature from 300 to 500° C., and more preferably from 420 to 480° C. This low growth temperature can avoid phase separation, InN decomposition and In desorption during the growth of high-In-content InGaN, while keeping high crystal quality due to the larger surface migration length of In compared to that of Ga.

Further, the In content of the InGaN-based epitaxial layer of the flux may be controlled by adjusting the In-to-Ga flux ratio according to actual requirements. The In-to-Ga flux ratio can be achieved by adjusting the temperature of the In and Ga flux sources (molecular beam epitaxy), or by adjusting mass flow controllers for metalorganic precursors.

Further, in the above method of the present disclosure, the InGaN-based epitaxial layer may be grown with molecular beam epitaxy and metalorganic vapor deposition.

Further, the total Ga plus In metal fluxes may correspond to a growth rate from 0.1 to 1 μm/h for the InGaN-based epitaxial layer.

Further, the silicon substrate may be a Si device with a specific layered structure exposing Si (111) or (100) crystallographic plane or surface.

Further, the silicon substrate may have been or not been subjected to nitridation.

The inventor found that, during the initial stage of conventional, continuous growth of InGaN-based epitaxial layer on the Si substrate, metal droplets can be formed at a low active nitrogen (N)-to-metal flux ratios (e.g., being 5 or less). For continuous epitaxial growth of InGaN-based materials, once the surface of the Si substrate is fully covered with InGaN-based materials, which has a high surface reactivity/catalytic activity, no more metal droplets are formed and existing metal droplets are even be consumed to form InGaN. Although the metal droplets can be completely consumed during later stages of epitaxial growth, but still strongly degrade the quality of the InGaN epitaxial layers. With researches, the inventor found that the metal droplets are formed in the initial stage of the epitaxial growth of the InGaN due to a low surface reactivity and catalytic activity of Si substrate, which is insufficient to promote the reaction of Ga and In metal atoms with active N flux to form InGaN.

In an embodiment of the present disclosure, the formation of the metal droplet is avoided in the initial stage of the direct, epitaxial growth of the InGaN-based layer on the Si substrate, by increasing an average active N flux during the growth of the first InGaN layer (as shown in FIG. 2). This can achieve the purpose of improving the quality of the InGaN-based epitaxial layer. Specifically, during the growth of the first InGaN layer, the high active N-to-metal flux ratio, for example, the active N-to-In/Ga total metal flux ratio above 5 and preferably 5 to 10, can overcome the low surface reactivity/catalytic activity of the surface of the Si substrate. In this way, Ga and In react with active N to avoid the formation of metal droplets in the initial growth stage of InGaN.

In another embodiment of the present disclosure, the formation of the metal droplets may be avoided in the initial stage of the direct epitaxial growth of the InGaN-based layer on the Si substrate by periodically growing the first InGaN layer (as shown in FIG. 1). For example, the first InGaN-based layer is grown during the time t1 and then is interrupted during the time t2, such growth sequence is repeated for 10 to 30 times, and preferably for 15 to 30 times, which is sufficient to make the Si surface be fully covered by the InGaN-based materials. Preferably, the time t1 may correspond to the deposition of 0.1 to 2.0 InGaN-based atomic layers, and preferably 0.4 to 0.5 InGaN-based atomic layer; and the time t2 may correspond to 2 to 20 seconds, and preferably 8 to 12 seconds. In this embodiment, the active N flux may be continuously supplied during the growth of the first InGaN-based layer. The active N flux is not particularly limited and may be supplied by a conventional flux. During the periodic growth of the first InGaN-based layer, the active N flux may be continuously supplied by a radio frequency active N plasma source or by ammonia, and the active N flux may be the same or larger than the total In and Ga flux during the time t1. In this embodiment, the growth time t1 is set to correspond to the deposition of 0.7 or less InGaN-based atomic layer so as to avoid the formation of the metal droplets. This is because the critical deposition for the metal droplets is about 0.7 monolayer. It is important to supply only the active N flux during the time t2, so that all Ga and In metals can react with the active N on the surface of the Si substrate to form InGaN.

After the surface of the Si substrate is fully covered by the first InGaN-based layer, the continuous epitaxial growth of the InGaN can proceed with conventional active N fluxes and metal fluxes, that is, common active N-to-metal flux ratios. This is because the first InGaN-based layer has high surface reactivity/catalytic activity, and thus the growth of InGaN-based materials can continue without the formation of metal droplets.

Further, in the above two embodiments, the active N flux of the first InGaN layer can be set independently of the active N flux for the growth of the second InGaN layer. For example, for the metal modulation mode, the active N flux for the growth of the first InGaN layer may be the same as the active N flux for the growth of the second InGaN layer. After the growth of the first InGaN layer, the active N flux and the metal In/Ga flux may be continuously supplied to maintain the continuous growth of the second InGaN layer. The active-N-to-metal In/Ga flux ratio may be adjusted to obtain the desired structure and morphology of InGaN. For example, a compact layer could be obtained when the active-N-to-metal flux ratio is close to stoichiometry, and nanowires could be obtained when the active-N-to-metal flux ratio is 2 to 5. Such fluxes and ratios may be set conventionally.

In another aspect of the present disclosure, a Si-based InGaN epitaxial layer is prepared by the above method of the present disclosure.

Further, the Si-based InGaN epitaxial layer comprises a first and second InGaN layers.

Further, the first InGaN layer may be grown in a metal modulation mode or at a highly active-N-to-total metal flux ratio.

Further, the second InGaN epitaxial layer may be designed with different layered or nano-morphology structures according to specific device requirements.

The term "first InGaN layer" herein refers to an InGaN layer which, during the initial stage of epitaxial growth on a substrate, is grown in a metal modulation mode or at highly active N-to-total metal flux ratio.

Unless otherwise specified, the content in percentage used herein, such as 30% In content, is an atomic stoichiometric ratio.

For the silicon-based InGaN epitaxial layer and the preparation method thereof provided by the present disclosure, no buffer layer such as GaN, AlN or a combined buffer layer is needed to insert between the silicon substrate and the InGaN-based layer, with obtaining a silicon-based InGaN epitaxial layer having good quality. In addition, the silicon-based InGaN epitaxial layer and the preparation method thereof provided by the present disclosure can be applied to the epitaxial growth of InGaN-based layers, especially to the growth of two distinctly classes of epitaxial structures applied most widely for optoelectronic and electrochemical devices: (i) arrays of one-dimensional nanowires, formed at high active-N-to-metal flux ratios (typically between 2 and 5); and (ii) compact, three-dimensional, single-crystalline layers, formed at active-N-to-metal flux ratios close to stoichiometry. In addition, since no buffer such as GaN, AlN or combined buffer layer is introduced, the growth processes of the InGaN epitaxial layers are greatly simplified in the present disclosure.

BRIEF DESCRIPTION OF THE DRAWINGS

The present disclosure is further described hereinafter with reference to the accompanying drawings and the specific embodiments. The exemplary embodiments of the present disclosure are illustrated in the accompanying drawings, wherein similar reference numerals indicate the same or similar elements. In the drawings.

DETAILED DESCRIPTION

The present disclosure is described in detail hereinafter through the specific embodiments. However, it should be understood that the present disclosure is not limited to the following specific embodiments. The scope of protection of the present disclosure is defined by the enclosed claims. The following embodiments of the present disclosure may be arbitrarily changed and combined. Directional terms mentioned in the embodiments, such as "up", "down", "front", "back", "left", "right", and the like, are only the directions of the reference drawings, and are not used to limit the scope of protection of the present disclosure.

Example 1

Figure 1:
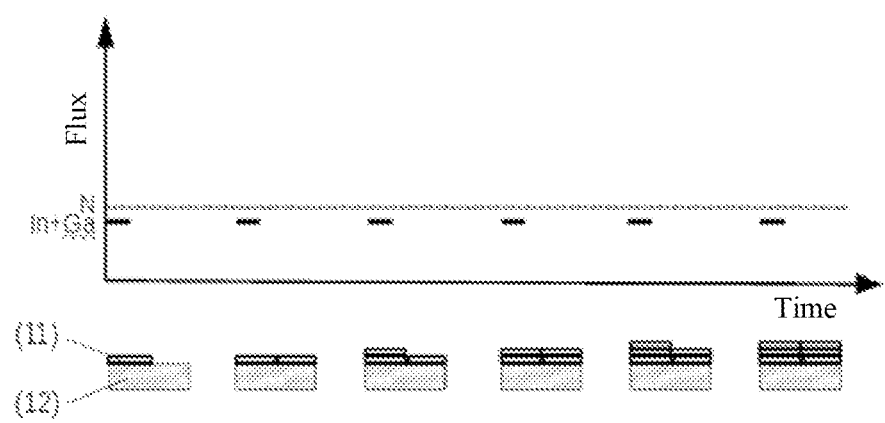
FIG. 1 shows a schematic diagram illustrating the growth of an InGaN-based epitaxial layer according to an embodiment of the present disclosure. In this embodiment, a metal modulated growth is employed in the initial stage of the direct growth of a first InGaN-based layer (11) on a Si substrate (12). It shows the active N flux and metal flux as a function of time in the upper panel of the figure, and, schematically shows the growing InGaN-based epitaxial layer at the lower panel of the figure. Each indicated growth step corresponds to the deposition of half an atomic layer of InGaN. In this figure, the sizes of different parts are not shown to scale. For example, the thickness of the InGaN-based epitaxial layer is exaggerated for clarity.
Figure 2:
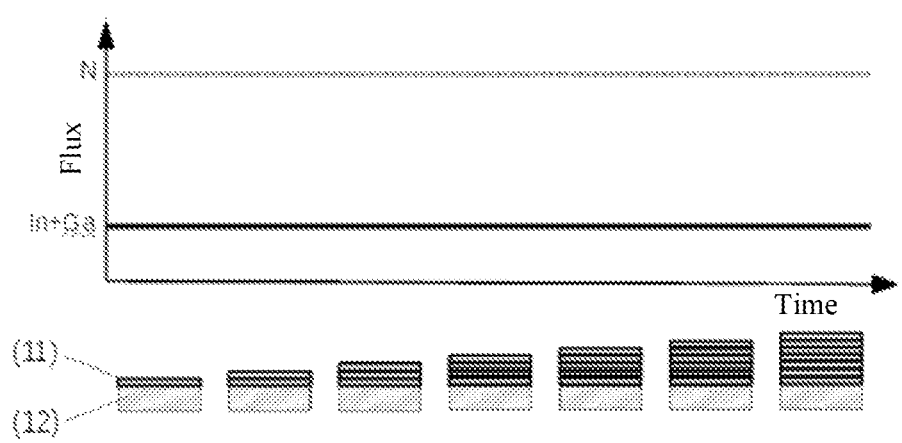
FIG. 2 shows a schematic diagram illustrating the growth of the InGaN-based epitaxial layer according to another embodiment of the present disclosure. In this embodiment, the growth under a high active nitrogen-to-metal flux ratio is employed in the direct growth of a first InGaN-based layer (11) on a Si substrate (12). It shows the active N flux and metal flux as a function of time in the upper panel of the figure, and schematically shows the growing InGaN-based epitaxial layer in the lower panel of the figure. Each indicated growth step corresponds to the deposition of one InGaN monolayer. In this figure, the sizes of different parts are not shown to scale. For example, the thickness of the InGaN-based epitaxial layer is exaggerated for clarity.

In this example, an InGaN-based epitaxial layer is grown with metal modulation during the initial growth of InGaN-based material, leading to a nanowire (columnar) structure. As shown in FIG. 1, the method for preparing the InGaN-based epitaxial layer comprises the following steps:

1) Selecting a Si (111) substrate, and subjecting the substrate to surface nitridation in a molecular flux epitaxial reaction chamber.

2) Growing a first InGaN-based layer on the nitrided Si substrate with plasma-assisted molecular beam epitaxy (PA MBE), at a growth temperature of 450° C., by employing pure metallic Ga and In as source materials, and a radio frequency active N plasma source for providing the active N flux. The active N-to-metal flux ratio is about 3, and the first InGaN layer is grown with metal modulation. The growth time t1 is 1 second, with simultaneously providing active N and In/Ga fluxes. Then, the growth time t2 is 9 seconds, without providing the In/Ga fluxes and with continuously providing the active N flux. This step is repeated for 20 times, leading to the first InGaN-based layer.

3) Keeping the growth of the InGaN-based layer (a compact layer) for about 1 hour.

During the above process, the In content of the InGaN-based material is controlled by adjusting the In/Ga flux ratio, and the active N/metal flux ratio is maintained at about 3. The obtained InGaN-based layer has a thickness of about 600 nm.

In contrast, a control InGaN-based epitaxial layer is prepared by a process which is substantially the same as the above process, except omitting the step 2).

The Omega/2 theta XRD spectra are recorded around the symmetric (0002) InGaN reflection of the InGaN-based epitaxial layer of the present disclosure and of the control InGaN-based epitaxial layer. Results are shown in FIG. 3, in which higher XRD intensity peak indicates better crystal quality.

Figure 3:
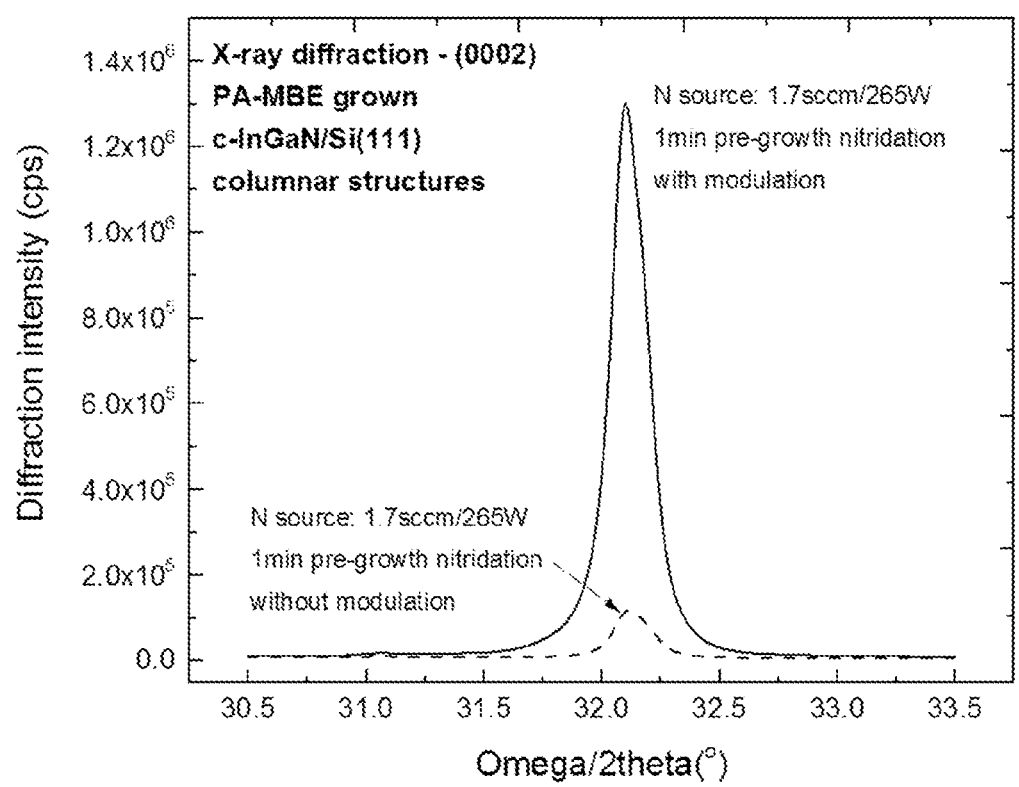
FIG. 3 shows the X-ray diffraction (XRD) spectra of the InGaN-based epitaxial layers prepared according to an embodiment of the present disclosure. In the figure, the solid line and the dotted line indicate the XRD spectra of the InGaN-based epitaxial layers grown with and without metal modulation on the Si (111) substrate subjected to surface nitridation, respectively.

It can be seen from FIG. 3 that both the intensity peaks of the InGaN-based epitaxial layers prepared by the above two processes (with or without the step 2)) are centered at 16.07°. The In content is about 71%. The intensity peak (indicated by a solid line) of the InGaN-based epitaxial layer prepared by the method of the present disclosure (the first InGaN layer grown with metal modulation) is about 6 times higher than that of the control InGaN epitaxial layer (indicated by the dotted line). This indicates that the InGaN-based epitaxial layer prepared by the method of the present disclosure has significantly improved quality.

Example 2

In this example, a nanowire (columnar) structure is prepared by employing a high active-N-to-total metal flux ratio during the initial growth of InGaN. The process comprises the following steps:

1) Selecting a Si (111) substrate, and subjecting the substrate to surface nitridation in a molecular flux epitaxial reaction chamber for 1 minute.

2) Growing an InGaN-based layer on the nitrided Si substrate with PA MBE, at a growth temperature of 450° C. for 1 hour, by employing an active N-to-total metal flux ratio of 6 or 3, respectively, employing pure metallic Ga and In as source materials, a radio frequency active N plasma source for providing the active N flux. The obtained InGaN-based layer has a thickness of 600 nm.

For the epitaxial growth of InGaN-based material, the active N-to-total metal flux ratio during the initial growth of InGaN can greatly influence the quality of the prepared InGaN-based layer. While, after the initial growth, any change of the active N-to-total metal flux ratio in subsequent growth may mainly affect the epitaxial growth mode, without significantly affecting the crystal quality of the InGaN-based epitaxial layer. In this example, it found that, during the initial growth stage of InGaN, the change of the active N-to-total metal flux ratio at the interface between the substrate and the InGaN-based layer can be regarded as a factor that significantly affects the quality of the InGaN-based layer.

The Omega/2 theta XRD spectra are recorded around the symmetric (0002) InGaN reflection of the InGaN-based layers prepared under the active N-to-total metal flux ratio of 6 and 3, respectively. Results are shown in FIG. 4, in which higher XRD intensity peak indicates better crystal quality.

Figure 4:
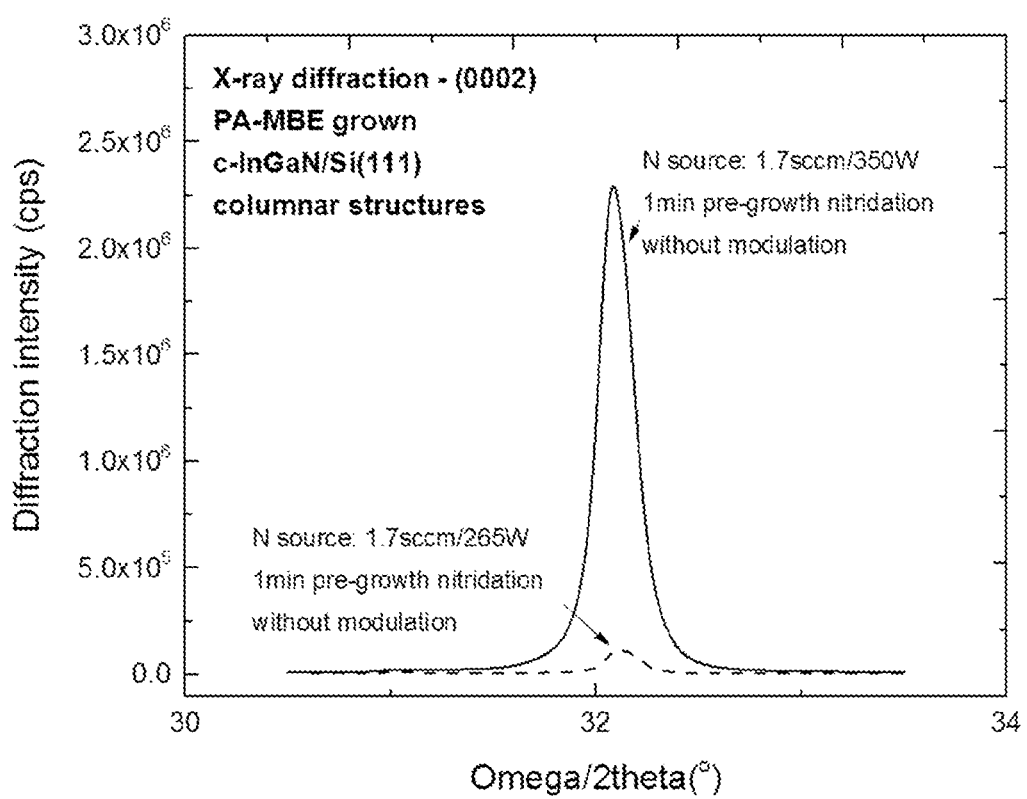
FIG. 4 shows X-ray diffraction (XRD) spectra of the InGaN-based epitaxial layers prepared according to another embodiment of the present disclosure. In the figure, the solid line and the dotted line indicate, during the growth of the first InGaN layer, the XRD spectra of the epitaxial InGaN-based layers grown at an active N-to-total metal flux ratio of 6 or 3, respectively.

It can be seen from FIG. 4 that similar nanowire (columnar) structures are by employing different active N-to-total metal flux ratios during the initial growth of the InGaN-based material. Both the intensity peaks of the InGaN-based epitaxial layers are centered at 16.070. The In content is about 71%. The intensity peak (indicated by the solid line) of the InGaN-based epitaxial layer prepared with the active N-to-total metal flux ratio of 6 is about 10 times higher than that of the control InGaN-based epitaxial layer (indicated by the dotted line) prepared with the active N-to-total metal flux ratio of 3. Such results show that the quality of the InGaN-based epitaxial layer is significantly improved by employing a high active N-to-total metal flux ratio during the initial growth of InGaN.

It should be understood that the above contents only intend to illustrate the preferred embodiments of the present disclosure, but not to limit the present disclosure. Those skilled in the art can make various equivalent changes or substitutions without departing from the scope of the present disclosure. All these equivalent changes or substitutions fall within the scope defined by the claims of the present disclosure.

What is claimed:

1. A method for preparing an InGaN-based epitaxial layer on a Si substrate, comprising:
   1) directly growing a first InGaN-based layer on a Si substrate; and
   2) growing a second InGaN-based layer on the first InGaN-based layer;
   wherein on the Si substrate, growing the first InGaN-based laver with a metal modulation or an active N-to-total metal flux ratio;
   the active N-to-total metal flux ratio referring to an active N-to-total metal In/Ga flux ratio of 5 or higher; and
   the step of growing the first InGaN-based laver with the metal modulation comprises:
   i) providing In, Ga and N fluxes, simultaneously, for time t1,
   ii) maintaining the N flux for time t2 and, simultaneously, interrupting the In and Ga fluxes; and
   iii) repeating the steps i) and ii) for n times,
   wherein,
   the time t1 corresponds to deposition of 0.1 to 2.0 InGaN atomic lavers;
   the time t2 corresponds to 2 to 20 seconds; and
   n is an integer selected from 10 to 30.

2. The method according to claim 1, wherein an active N flux is continuously supplied by a radio frequency active plasma source or by ammonia.

3. The method according to claim 1, wherein Ga and In metal fluxes are provided by Ga and In sources.

4. The method according to claim 1, further comprising adjusting an In-to-Ga flux ratio such that the InGaN-based epitaxial layer has an In content ranging from 0 to 1, wherein
   when the In-to-Ga flux ratio is 0.4 or less, producing an InGaN-based epitaxial layer having an In content of 30% or less, at a growth temperature ranging from 600 to 900° C.; or
   when the In/Ga flux ratio is higher than 0.4, producing InGaN epitaxial layer having an In content of higher than 30%, at a growth temperature ranging from 300 to 500° C.

5. The method according to claim 1, wherein the InGaN-based epitaxial layer is grown with molecular beam epitaxy and metalorganic vapor deposition.

6. The method according to claim 1, wherein total metal Ga and In fluxes correspond to a growth rate of the InGaN-based epitaxial layer of 0.1 to 1 μm/h.

7. A silicon-based InGaN epitaxial layer prepared by the method according to claim 1.

8. The method according to claim 1, wherein the time t1 corresponds to deposition of 0.4 to 0.7 InGaN atomic layers.

9. The method according to claim 1, wherein the time t1 corresponds to deposition of 0.4 to 0.5 InGaN atomic layers.

10. The method according to claim 1, wherein the time t2 corresponds to 8 to 12 seconds.

11. The method according to claim 1, wherein n is an integer selected from 15 to 25.

12. The method according to claim 1, wherein the active N-to-total metal In/Ga flux ratio is between 5 and 10.

13. The method according to claim 1, wherein the first InGaN-based layer comprises 5 to 15 atomic layers.

14. The method according to claim 1, wherein the first InGaN-based layer comprises 8 to 12 atomic layers.

15. The method according to claim 3, wherein the Ga and In sources are pure Ga and In metals, or metal organic precursors of the pure Ga and In metals, respectively.

16. The method according to claim 4, wherein,
when the In-to-Ga flux ratio is 0.4 or less, the growth temperature ranges from 700 to 750° C.; or
when the In/Ga flux ratio is higher than 0.4, the growth temperature ranges from 420 to 480° C.

* * * * *